United States Patent [19]

Halldörsson et al.

[11] Patent Number: 5,265,113
[45] Date of Patent: Nov. 23, 1993

[54] INTEGRATED MICROSYSTEM

[75] Inventors: Thorsteinn Halldörsson, Munich; Walter Kroy, Ottobrunn; Peter Peuser, Hohenbrunn-Riemerling; Helmut Seidel, Starnberg; Paul Zeller, Munich, all of Fed. Rep. of Germany

[73] Assignee: Messerschmitt-Bölkow-Blohm GmbH, Ottobrunn, Fed. Rep. of Germany

[21] Appl. No.: 663,840

[22] Filed: Mar. 26, 1991

[30] Foreign Application Priority Data

Jul. 29, 1989 [DE] Fed. Rep. of Germany ....... 3925201

[51] Int. Cl.⁵ ................................................ H01S 3/19
[52] U.S. Cl. ...................................... 372/36; 372/34; 372/35
[58] Field of Search ............................ 372/34–36, 372/43

[56] References Cited

U.S. PATENT DOCUMENTS

| | | | |
|---|---|---|---|
| 4,466,696 | 8/1984 | Carney | 372/7 |
| 4,768,199 | 8/1988 | Heinen et al. | 372/36 |
| 4,827,485 | 5/1989 | Scerbak et al. | 372/107 |
| 5,031,184 | 7/1991 | Greve et al. | 372/34 |
| 5,068,865 | 11/1991 | Ohshima et al. | 372/36 |
| 5,113,404 | 5/1992 | Gaebe et al. | 372/36 |

FOREIGN PATENT DOCUMENTS

| | | |
|---|---|---|
| 0171615 | 2/1986 | European Pat. Off. . |
| 0251718 | 1/1988 | European Pat. Off. . |
| 1917005 | 10/1970 | Fed. Rep. of Germany . |
| 3630700 | 3/1988 | Fed. Rep. of Germany . |
| 3737251 | 5/1989 | Fed. Rep. of Germany . |
| 3925201 | 6/1991 | Fed. Rep. of Germany . |

OTHER PUBLICATIONS

Angell et al., "Mikromechanik aus Silicium", Spektrum der Wissenschaft, Jun. 1983, p. 38.

Brady, "Fabrication Processes for a Silicon Substrate Package for Integrated GaAs Laser Arrays", J. Electrochem. Soc. Solid State Science and Technology, Oct. 1978, pp. 1642–1647, vol. 125, No. 10.

Primary Examiner—Georgia Y. Epps
Attorney, Agent, or Firm—Anderson Kill Olick & Oshinsky

[57] ABSTRACT

Integrated microsystem comprising electrical and nonelectrical, particularly optical functions in a laser system, wherein a base comprising anisotropically etchable semiconducting material on which etching structures for receiving optical and/or electro-optical and electrical/electronic and/or fluidic and/or mechanical elements or their mountings are arranged in predetermined distances and/or levels, as well as integrated switching circuits, and that at least a part of the optical, electro-optical or mechanical elements or their mounting is controllable and movable electrically in such a way that its position relative to the base is actively changeable, and that at least one sensor is provided which determines the effect of the position change on the function of at least a part of a microsystem and supplies a signal for repeated readjustment (self-adjusting) of optical elements and their mounting.

11 Claims, 3 Drawing Sheets

INTEGRATED MICROSYSTEM

FIELD OF THE INVENTION

The invention is directed to a microsystem for holding optical, electrical and other components and for receiving, applying or arranging electronic, electrical, hydraulic, pneumatic and/or mechanical elements and devices, as well as means for coupling and decoupling energy in every form.

BACKGROUND OF THE INVENTION

Prior art and technical background which invention is based:

Developments in electro-optics for communications, sensor engineering, data storage and control and regulating technology are presently tending increasingly toward microminiaturization and integrated electro-optics. Until now, a miniaturization of laser sources was only possible in the area of semiconductor lasers. The reduction in size of the construction of solid-state lasers has been hindered by the poor efficiency of the conversion of electrical power into laser light, the size of the excitation sources, discharge lamps of the optical bank and individual optical elements which are still manufactured in the classical manner of construction.

The size of the optical head of continuous wave lasers in the power range of 1-100 W in conventional construction is typically $10 \times 10 \times 20$ cm and the power supplies with cooling units have a weight of 10-100 kg, depending on the power range. This size of device and especially the poor efficiency greatly impedes the integration of lasers in various systems, e.g. in medicine, material processing, holography, display technology and measuring technology, and is one of the significant reasons for the relatively limited use of lasers in these fields.

A miniaturization of solid-state lasers is desirable not only for this reason; it would also considerably facilitate the use of automated manufacturing methods of lasers and laser components.

Laser diodes with GaAlAs semiconductors have been commercially available for a few years; they are constructed as an array in the range of 100 mW to several Watts optical continuous output and are suitable for exciting solid-state lasers. The first laser of this type is the diode-pumped Nd:YAG laser with the emission line $\gamma = 1.06$ μm which is distinguished by an electric-optical efficiency approximately 10 times higher than that of lasers conventionally excited by discharge lamps.

The advantage of converting the radiation of a laser diode into the radiation of a solid-state laser consists in the considerably improved beam quality of the latter and its low spectral bandwidth. An improvement by a factor of more than $10^6$ is achieved here with reference to the spectral radiation density.

Diode-pumped solid-state lasers are described e.g. in the periodical "Laser and Optoelectronics" [Laser und Optoelektronik] 20 (3)/1988, pages 56-67.

Although these lasers represent clear progress in the direction of an increase in efficiency and miniaturization, the additional structural component parts such as laser mirror, microsystem, cooler, beam switcher and imaging lens system are still manufactured with conventional techniques which hardly enables a significant reduction in size. Its size exceeds that of the base elements such as the laser diode array, e.g. with dimensions of $22 \times 100$ μm and the laser crystal with $2 \times 5$ mm, e.g. by an order of magnitude.

A simple and economical solution to the cooling of a laser diode and other optical/electronic components is currently one of the most urgent problems for miniaturization and is an object of the invention, as is the integration of the latter in a suitable mounting.

The coolers for the laser diodes, which are usually provided as Peltier, radiant or liquid coolers, are many times greater and more massive than the diode housing, e.g. of size T03. The diode housing itself, with a diameter of 100 mm, is many times larger than the diode chip itself, which has a diameter of 1 mm. In this case also, a more simple and economical solution is sought for.

A peculiarity of the laser diode-pumped solid-state laser consists in that the spectral position of the emission lines of the diode must be adapted exactly to the most effective absorption line of the laser material. This is presently achieved by means of correct doping of the semiconductor. Since the emission wavelength of the semiconductor is also dependent on the temperature, the temperature must be readjusted by means of the diode, depending on the adjusted electrical current. The output of the solid-state laser itself is usually used as a measurement variable for regulating, and the temperature of the diode is readjusted to the maximum output of the laser. It is necessary to regulate a second time in order to keep the output of the laser diode as stable as possible. In this instance, the optical power of the diode is measured and readjusted during a possible change in current. The two regulating circuits overlap one another and must be tuned to one another.

SUMMARY OF THE INVENTION

Description of the invention in general: The invention has the object of achieving a substantial miniaturization of a microsystem and the integration of electrical and nonelectrical, particularly optical structural components such as e.g. diode-pumped (solid-state) laser systems or other microsystems and their reciprocal connections of an electrical and nonelectrical type, wherein changes in position of the structural components or structural component parts are to be advantageously carried out in a controllable manner.

The basic solution, according to the invention, is the microsystem as common base with the fixing and reciprocal adjustment of the individual components. Moreover, this base should also integrate the cooler conducting off the heat converted in the laser, as well as electronic components for monitoring and controlling the laser functions in particular. It is suggested here to use a semiconductor substrate for this integral optical bank. Primarily, (crystalline) silicon is considered for this purpose, silicon being very widely used in microelectronics at present. However, other semiconductor substrates such as GaAs or InP can also be used.

The use of a semiconductor material makes it possible to use the highly developed process techniques of planar technique and micromechanics which allow a very accurate structuring in the micrometer range with high reproducibility. Further, because of the batch method, a very favorable price development can be expected with an appropriate piece number. Surface mounting (SMD) and computer-controlled manufacturing (CIM) can be applied.

This new substrate, as common microsystem base of a laser, is provided with precise adjusting means comprising guidance and fastening grooves in which individual components such as mirror holders, imaging elements and laser crystals can be fixed with known connection techniques. These grooves are produced with anisotropic etching methods known from micromechanics. Further, heat exchanger ducts are to be produced for the liquid cooling of the heat producing components, particularly the pump laser diodes, but possibly also for the laser crystal and the regulating electronics, likewise with anisotropic etching methods. The direct integration of a temperature gauge at the location of the laser diode as well as the respective regulating electronics is provided for regulating this cooling. The direct integration of a microvalve for controlling the liquid flow is also possible. However, the use of a small discrete single valve should not be ruled out. Further, detectors for monitoring the radiation of the pump diode and the solid-state laser can be integrated on the semiconductor substrate with the respective signal processing and regulating electronics for driving the laser diode.

In addition to the known excellent electrical properties, very good mechanical and thermal characteristics, which are comprised in the following comparison table, speak in favor of the selection of the semiconductor material, such as silicon:

|  | Si | Cu | Al | SiO$_2$ |
|---|---|---|---|---|
| specific gravity (g/cm$^3$) | 2.33 | 8.96 | 2.70 | 2.65 |
| modulus of elasticity* 10$^{12}$ (dyn/cm$^2$) | 0.6–1.7 | 1.1 | 0.7 | 0.7 |
| heat capacity (Ws/g K) | 0.71 | 0.38 | 0.90 |  |
| heat conductance (W/cm K) | 1.48 | 4.01 | 2.37 | 0.0132 |
| thermal expansion *10$^{-6}$ | 2.4 | 16.6 | 25.0 | 1.5 |

It can be seen from these thermo-mechanical data that silicon has substantially more favorable properties overall compared to the metallic materials for the mechanical structure, heat conduction and temperature regulation of a laser. The advantages of the silicon are even more far-reaching in miniaturization, in the integration of the multifold mechanical, thermal, optical and electronic functions within a limited space and in series manufacturing of the entire laser with the aforementioned manufacturing methods known from microelectronics and micromechanics.

With the invention, the size of a laser head which is produced in silicon or another semiconductor material of group III to V of the periodic table of elements and comprises an optical bank in the (e.g. Nd: YAG) continuous wave power range of 1–100 W is only a few centimeters, and the weight of the power supply and cooling device is between 1 and 10 kg. A reduction in the size and weight by an order of magnitude relative to the conventionally produced lasers is accordingly achieved.

BRIEF DESCRIPTION OF DRAWINGS

Description of details of the invention with reference to embodiment examples.

DESCRIPTION OF PREFERRED EMBODIMENTS

The various individual functions of the laser system realized in the first embodiment example will now be explained in more detail. The fundamental characteristic of the microsystem of a laser is the adjustability and fastening of the individual function elements relative to the common optical axis. In the laser, an exact positioning is necessary in all three spatial coordinates (x,y,z) and around the two solid angles in azimuth and elevation ($\phi$, $\psi$). The tolerances amount to approximately 0.1 mm in position and approximately $10^{-4}$ rad in the angle.

The invention proceeds from the fact that every part is immovably fixed in a stationary position, as is conventional in modern lasers. Accordingly, it must be a precondition for series manufacturing that individual parts such as mirrors, laser crystal or deflection and imaging lens system, including their mountings, be manufactured beforehand with the necessary close tolerances. Then, it is possible to achieve the required adjusting accuracy by means of exact positioning of adjusting means in the semiconductor substrate—base 1—serving as microsystem. These adjusting means can be constituted in various ways depending on the shape of the object to be positioned.

Figure 1:
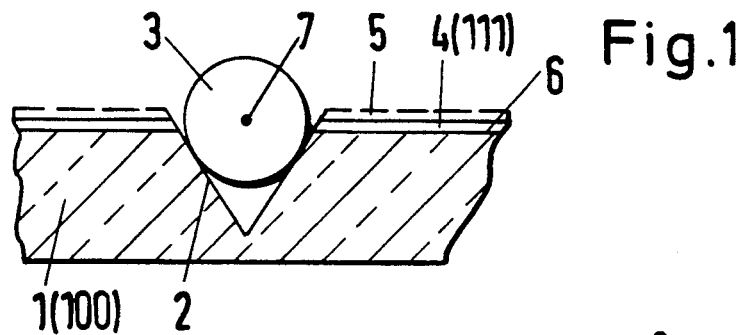
FIG. 1 shows a V-groove on <100> substrate as adjusting means for cylindrical objects.

The use of crystallographically fixed V-grooves 2 is offered for the adjustment of cylindrical components, e.g. the laser crystal or the required imaging lens system. It is suggested to use a semiconductor substrate of crystal orientation (100) and to form the V-grooves by means of the (111) crystal planes which have an angle of inclination of 54.7° relative to the substrate surface. For this purpose, the substrate is coated with a passivation layer, e.g. SiO$_2$ or Si$_3$N$_4$ and structured with photolithography. Subsequently, etching is effected anisotropically with the known etching solutions (e.g. KOH or ethylenediamine water). The resulting geometry of the V-groove is determined with greater precision due to the geometrical dimensioning of the etching mask 5. The height of the optical axis 7 with reference to the substrate surface 6 can also be adjusted in a very accurate manner (see FIG. 1) with a known diameter (radius r) of the object (optical part) to be adjusted. The low residual etching rate of the (111) crystal planes can be taken into account in the layout of the lithography mask, so that accuracies in the micrometer range can be achieved.

Figure 2:
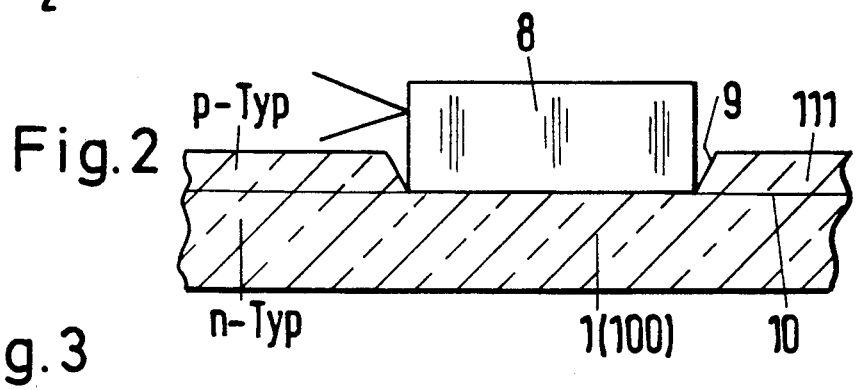
FIG. 2 shows adjusting means for planar components by means of an anisotropically etched recess in the microsystem (semiconductor substrate)

In order to adjust planar components, e.g. the (laser) diode 8, recesses 9 can be etched into the semiconductor 1 which are likewise defined by <111> crystal surfaces. An etching stop can be built in at periodic intervals (not shown) in order to accurately define the etching depth. A possibility consists in the production of a p-n junction 10 in the desired depth by means of epitaxy or ion implantation. A very precise stop is effected at the barrier layer 10 by means of electrochemical, anisotropic etching. Highly doped layers can be used as a further possibility, an etching stop likewise being effected at the latter. An example of this is shown in FIG. 2.

Figure 3:
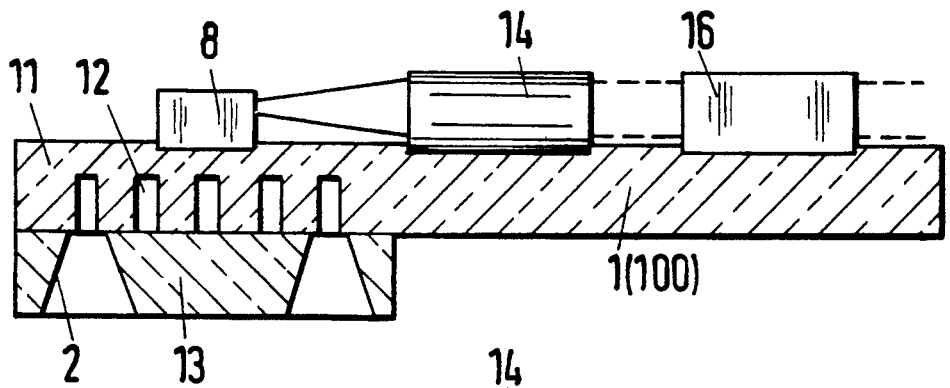
FIG. 3 shows integrated guidance of the cooling ducts directly in the optical bank.

If a cooling element 11 is to be integrated, as shown in FIG. 3, it can also be advantageous, as described in the following, if the substrate 1 takes up the crystal orientation (110). V-grooves 2 with a flank angle of 35.3° relative to the wafer surface are used for guiding the cooling water. Further, this substrate type allows the production of grooves with vertical flanks 12.

Various methods are available for fixing the components 3 in the adjusting means. Glass parts 13 can be connected with silicon parts 11 in a favorable manner by means of the so-called anodic connection technique. For this purpose, the parts are heated to 400°–500° C. and a voltage of 500–1000 V is applied. The connection occurs without an intermediate layer. Another possibility consists in the use of glass soldering with a low melting point which can also be applied as thin film and can lead to a stable connection by means of heating. Another connection method consists in the use of eutectic material, e.g. Si-Au, which forms a eutectic at 370° C. For this purpose, a gold layer is vacuum metallized on the (glass) part to be connected and then placed on the silicon part 11 (or 1)—or vice versa—and heated above the eutectic point. In the event that only low temperatures can be allowed in the connection, gluing techniques with suitable single or multiple-component adhesives can be used.

The second object of the microsystem is the conduction of heat from hot parts. This chiefly concerns the laser diode 8 and, with restrictions, also the other parts of the lens system, the electronics 15 and, with very high pump capacities, the laser crystal 16. Typical values of the electric-optical efficiency of the laser diode are currently 40–50%, i.e. 50–60% of the power is converted into heat. Typical outputs of the diodes 8 are currently in the range of 100 mW to 5W, so that corresponding thermal outputs of a very small volume must be guided off from a size far below 1 mm³. The most effective type of cooling is liquid cooling. The invention provides water as coolant. Cooling ducts 12 can be integrated into the semiconductor substrate 1 for this purpose.

These cooling ducts 12 can likewise be produced by means of anisotropic etching. A substrate 1 of crystal orientation (110) is best suited for this purpose, since very deep and, if necessary, also very narrow ducts 12 with vertical flanks can be produced in the latter. There are two possibilities for the principle arrangement (FIG. 3 and FIG. 4).

On the one hand, the ducts 12 can be etched into the microsystem directly and sealed by a second part 13 lying beneath it, which part 13 contains the feed ducts 2. This arrangement is shown in FIG. 3.

Figure 4:
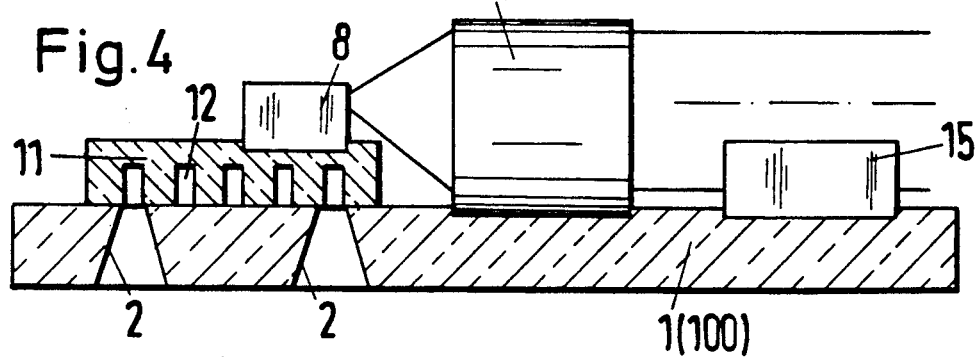
FIG. 4 shows guidance of the cooling ducts in a separate <100> substrate.

On the other hand, there is the possibility of mounting the laser diode 8 on its own small part 11, in which the required cooling ducts 12 are etched, and then mounting this total unit on the microsystem (see FIG. 4). Then the base 1 of the microsystem must take over the sealing function and contain the required feed ducts 2. The first possibility assumes that the base of the microsystem itself has the crystal orientation (110). This must be taken into account when laying out the structures of the adjusting means and, inasmuch, leads to a complication compared with (100) substrates, since there is no longer any orthogonal symmetry. With the second possibility, the orientation (100) can be maintained in the base 1 of the microsystem. Of course, the adjusting process is more costly in this case, since the diodes 8 must be positioned on the intermediate part 11 and the intermediate part must then be positioned on the base 1 of the microsystem with high accuracy.

Figure 5:
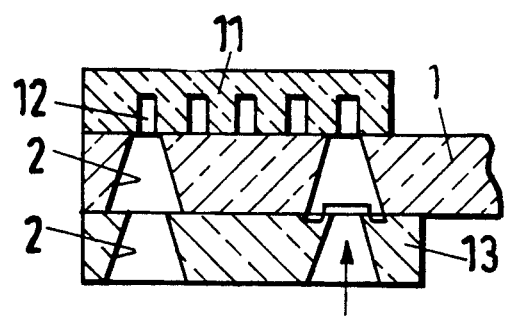
FIG. 5 shows a cooling device of the type according to FIG. 4 with additional integrated microvalve.

The temperature of the diodes 8 must usually be regulated with an accuracy of 0.1° C. Since the diode current, and accordingly the output, must be controllable, a regulating of the cooling is indispensable. The invention provides that the cooling water flow (feed, removal, throughput) is controlled via at least one valve 19 as a function of the temperature of the diode 8. In the simplest case, this valve is a discrete metering valve which is integrated in a hybrid construction. In a further development of the invention, however, a microvalve is to be integrated directly in the microsystem. This can occur e.g. in the construction form according to Patent DE 36 21 331 C2. A possible construction for this is shown in FIG. 5.

In order to determine the temperature it is possible to integrate a temperature gauge 20 in the microsystem, e.g. in the form of a temperature-dependent resistor, directly at the relevant location (e.g. at the diode 8). E.g. thin films of platinum, nickel or polycrystalline silicon can be considered as resistor material.

The invention further provides that the optical output of the laser diode 8 and laser crystal 11 is constantly monitored. This is effected in that a portion of the radiation (from 8) is directed to an optical detector 21 such as a photodiode. Accordingly, short-term and long-term fluctuations in the output of the diode 8 or the solid-state laser, respectively, can be compensated for via the diode current. This monitoring and regulating of the output (of 8) ultimately also offers the possibility of determining the temperature indirectly, since temperature fluctuations lead to a reduction in power. The electronic regulating is to be designed in such a way that the output of the laser is constantly maintained in the optimal range.

The electronics required for the overall system, e.g. sensor signal preamplifier, signal processing and evaluating circuit and regulating circuit for the diode current (of 8), or for controlling (with valve 19) the cooling, are generally manufactured separately for reasons of economy as IC's for specific clientele and bonded on the microsystem.

In so doing, devices for cooling the IC's with high power loss (e.g. for regulating the diode current) can be provided in the microsystem in the manner described above. The demand for constant temperatures is substantially less strict in this case (approximately +−10° C.) than in the pump diode. Built-in heat sinks can also be sufficient, particularly if heat barriers in the form of V-grooves are produced between the latter.

However, it is also provided in the invention to integrate all of the required electronics directly in the microsystem. This can be effected with the use of standard circuit technology, e.g. CMOS or bipolar. The entire system can accordingly be miniaturized and secured against interference to the greatest extent. The IC can also contain the control for the relative attitude/position/ distance/actuators or final control elements of optical parts.

It is further provided that other optical parts, particularly comprising micromechanically structured silicon, are likewise fastened on the microsystem comprising silicon or another semiconductor material as base 1. The mirrors 23, 24 used for the laser resonators are particularly advantageous as micromechanical, electrically controllable parts of the lens system 14. The constant automatic readjustment of the resonator 26 is enabled by means of such mirrors over the entire operating and service life of the arrangement.

For this purpose, according to the invention, one or more control diodes 21 are arranged in the outer area 25 of the resonator 26 in such a way that the integral intensity of the output radiation or other radiation parameters, e.g. the beam diameter, mode structure, beam direction or the modulation of radiation with reference to time, are continuously electronically recorded. The measured values are compared with externally predetermined reference values and, during deviations occurring randomly or as a result of external and internal disturbing influences such as shaking and current and voltage fluctuations, opposing controlling signals for actuators are produced which change the positions or movements or bending of the micromechanical mirrors of the lens system or other optical parts such as micromechanical beam shapers (diaphragms, annular apertures, prisms, gaps etc.). The generation and action of the control forces can be effected thermally, mechanically, in a fluidic, electrical, magnetic, thermo-mechanical, magnetostrictive, electromagnetic, piezoelectric or electrostatic manner.

The control arrangement, according to the invention, substantially increases the life of a laser, in contrast to present lasers, since adjustments or mechanical or electrical maintenance work is no longer required.

External adjusting mechanisms and the like are dispensed with accordingly, which enables a further reduction in the size of the product. The new microsystem is controllable, in its entirety, via a microcomputer and computer software, which constitutes a considerable simplification, increase in operating reliability, and flexibility for the user. As a result of the integration of fluidic, mechanical, electrical and optical elements in a very small space a multitude of plug connectors and lines are dispensed with, which usually cause approximately 50% of the errors and operating accidents. The arrangement, according to the invention, is accordingly particularly highly reliable, especially since there are no large movable parts which are subject to wear.

The base (semiconductor substrate), according to the invention, is also suitable for direct installation/ integration of couplers, particularly opto-couplers such as fiber-optic light guides as described for example in the periodical "Lasers and Optoelectronics" 20(3)/1988, page 66, and shown in illustrations 8, 9 and 10, or also in EP 0 197 117 B1.

Semiconductor lasers/solid-state lasers can be arranged in this way on a common microsystem not only as (light) emitters but also as (light) receivers for electromagnetic radiation. The signal output and evaluation can be effected in an optical/electrical or continuous (optimized) manner. Application can be generally for purposes relating to measurement techniques, but also for other purposes such as control, regulating, analysis, and communications technologies, particularly in connection with fiber-optic light waveguides.

The invention is not limited to the type of the described sensors, actuators, drives, control and regulating devices for a construction with micromechanical base, nor to electrical or nonelectrical components and their known connection possibilities, whether stationary or movable. Energy in every form, also after conversion, can be coupled and uncoupled and is applicable for all purposes of the invention, particularly according to claims 1 to 20.

The invention is not limited to the indicated embodiment examples.

Figure 6:
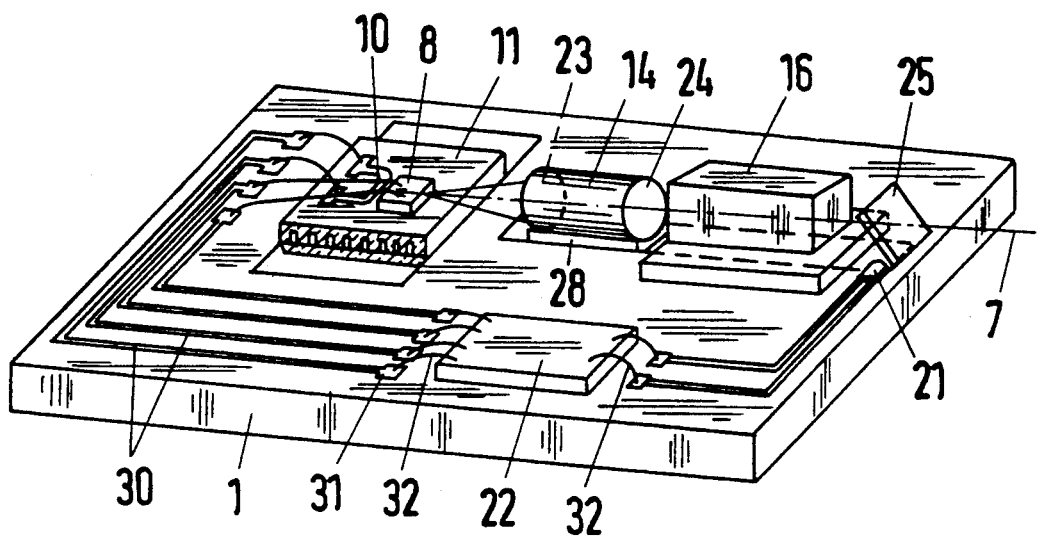
FIG. 6 shows a diagram of the microlaser with microsystem.

Whereas FIGS. 1 to 5 show details of a micromechanical base as microsystem, FIG. 6 contains a schematic view of the overall construction.

Figure 7:
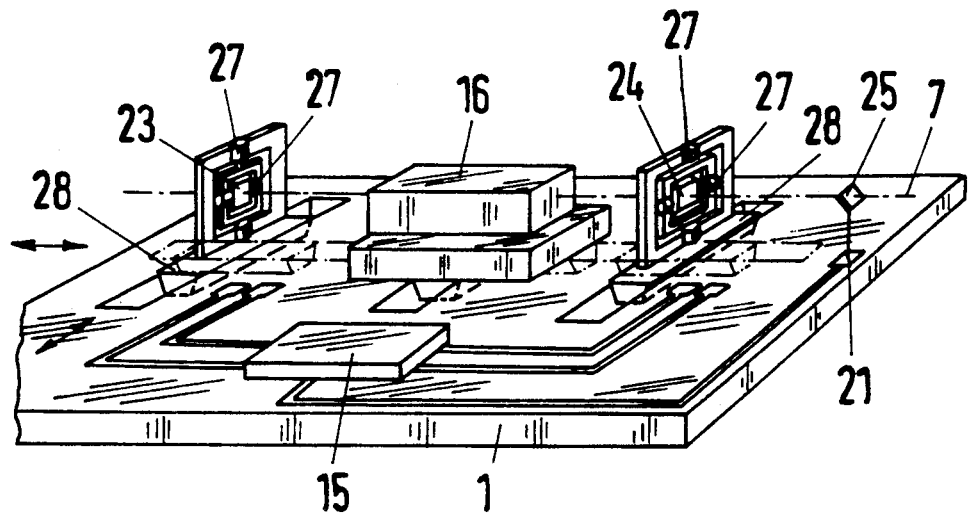
FIG. 7 shows a diagram similar to FIG. 6 with details such as mirrors and their movable support/mounting.

In contrast to FIG. 6, FIG. 7 shows the mounting 28 for optical parts such as mirrors 23, 24. In addition, the holding parts 28 are constructed in such a way that they can be displaced and/or offset (compare the arrows for possible sliding movement in the X-Y direction) in a cross-shaped manner (in one another) from two beams in the form of the V-grooves 2, e.g. electrically, magnetically, with fluidics (by means of excess pressure/vacuum pressure). The mirrors 23, 24, 25 are suspended by cardan joints and are movable by actuators 27, particularly swivelable, rotatable, longitudinally and/or transversely, as well as relative to other components, parts, elements of the systems and the base 1, also on other levels (Z direction).

Figure 8:
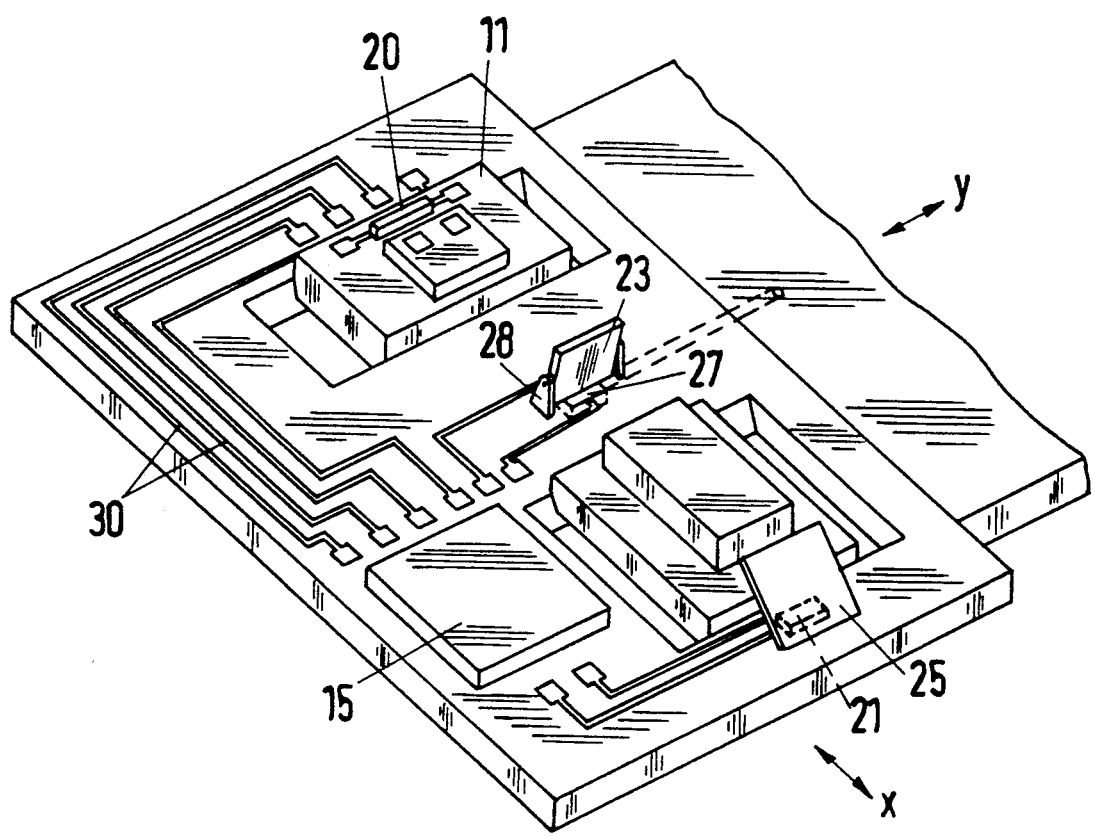
FIG. 8 shows a diagram similar to FIG. 6 on X-Y table for the movement of at least individual components of the microsystem corresponding to the arrows.

In FIG. 8—in a similar manner to FIG. 7—the system is arranged on an X-Y table or the base 1 forms a part of such a table which is program-controlled externally by a microprocessor or microcomputer, approximately in the manner of known X-Y tables, as described in EP 0 149 017 B1, or X-Y-Z tables as described in EP 0 319 602 A1.

The actuators/actuating drives and/or adjusting means and/or regulating means for position changes of individual components/structural component parts and their control can be selected by the person skilled in the art, depending on the case of application of the invention, and adapted to the latter. The same is true for the type of source, cooling, heat conduction and heat sinks, without being limited to the described constructions.

Depending on the case of application, external computers, processors, electronic control units, regulating means, evaluating and documenting (storage) devices can be connected.

We claim:

1. Integrated microsystem for electrical and nonelectrical, particularly optical means of a laser system, characterized in that it comprises a body of anisotropically etchable monocrystalline semiconductor material which takes over mechanical carrier functions for components of a solid state laser with pump diode, such as lens system, resonators, laser crystal and electronics/fluidics, which is provided with adjusting means such as V-grooves and recesses for the exact positioning of the components, and in that the semiconductor body simultaneously serves as a cooling body of the power-intensive components by means of built-in liquid cooling ducts.

2. The integrated microsystem of claim 1, wherein the active self-adjusting of the diode-pumped solidstate laser is effective over the entire operating life of the laser in order to maintain a reference position of at least some components.

3. The integrated microsystem of claim 1, wherein, in function elements of the diode-pumped laser which require a particularly high adjusting accuracy, such as resonator mirrors, beam deflectors, beam shapers, their mounting is constructed in such a way that they are accurately adjustable by means of actuators installed in the base by means of readjustment in a reference position, and wherein the control signal is derived from the measurement signal of laser radiation sensors which are integrated with the control electronics on the microsystem.

4. The integrated microsystem of claim 1, wherein a changeable component of the laser system is adjusted in an initial position with respect to at least one of its position and spacing only once shortly after production, particularly by means of displacing in V-grooves, and wherein other components are confined in this state for the operating life of the laser by means of one of casting means, adhesives, soldering and welding means.

5. The integrated microsystem of claim 1, wherein the control of the position of individual components of the laser system, particularly optical components of the system, is effected by one of a mechanical/electrical, a magnetic, a thermal, a fluidic and a mechanical manner.

6. The integrated microsystem of claim 1, wherein the control of the position of individual components of the laser system, particularly optical components of the system, is effected by means of flow movement of a medium which is one of fed and guided away.

7. The integrated microsystem of claim 1, wherein heat barriers are arranged in the microsystem by means of anisotropically etched V-grooves between areas with components with different temperature requirements.

8. The integrated microsystem of claim 1, wherein the cooling ducts consisting of parallel V-grooves are arranged in the direction of the crystal lattice of the semiconductor body as close as possible to the solid state laser.

9. The integrated microsystem of claim 1, wherein the control of the position of individual components of the laser system, particularly optical components of the system, is effected by means of at least one of actuators and drivers.

10. The integrated imcrosystem of claim 1, wherein at least a part of at least one of the optical, electro-optical, and mechanical elements, or their mounting, is controllable and movable electrically in such a way that its position relative to the base is actively changeable, and wherein at least one sensor is provided which is mounted on the base and which determines the effect of the position change on the function of at least a part of a microsystem and generates a signal which is compared with a reference signal for repeated readjustment of optical elements and their mounting in accordance with a difference between the two signals.

11. The integrated microsystem of claim 1, wherein said microsystem is constructed for adjusting a diode-pumped sold-state laser along an optical axis and for adjusting at least one of a laser control, a cooling, a coupling and an uncoupling of energy.

* * * * *